(12) United States Patent
Schiller et al.

(10) Patent No.: US 7,893,602 B1
(45) Date of Patent: Feb. 22, 2011

(54) DUAL-USE TRANSDUCER FOR USE WITH A BOUNDARY-STIFFENED PANEL AND METHOD OF USING THE SAME

(75) Inventors: Noah H. Schiller, Newport News, VA (US); Randolph H. Cabell, Hampton, VA (US)

(73) Assignee: The United States of America as reprensented by the Administrator of the National Aeronautics and Space Administration, Washington, DC (US)

( * ) Notice: Subject to any disclaimer, the term of this patent is extended or adjusted under 35 U.S.C. 154(b) by 100 days.

(21) Appl. No.: 12/328,162

(22) Filed: Dec. 4, 2008

(51) Int. Cl.
*H01L 41/04* (2006.01)
*H03H 9/25* (2006.01)
*G01L 1/00* (2006.01)
*G01M 5/00* (2006.01)

(52) U.S. Cl. .................. 310/367; 310/313 B; 310/318; 310/338; 73/767; 73/774; 73/778; 73/802

(58) Field of Classification Search ............. 310/313 R, 310/313 B, 318, 338, 367; 73/767, 774, 73/778, 802
See application file for complete search history.

(56) References Cited

U.S. PATENT DOCUMENTS

| | | | | |
|---|---|---|---|---|
| 3,179,823 | A | * | 4/1965 | Nesh .......................... 310/329 |
| 4,281,407 | A | * | 7/1981 | Tosima ....................... 369/130 |
| 4,477,892 | A | * | 10/1984 | Tosima et al. .............. 369/132 |
| 4,565,940 | A | | 1/1986 | Hubbard |
| 4,623,813 | A | * | 11/1986 | Naito et al. ............. 310/313 R |
| 4,849,668 | A | | 7/1989 | Crawley et al. |
| 5,054,323 | A | | 10/1991 | Hubbard et al. |
| 6,249,075 | B1 | * | 6/2001 | Bishop et al. ................ 310/338 |
| 6,254,708 | B1 | * | 7/2001 | Cappabianca ............ 156/89.12 |
| 6,341,528 | B1 | * | 1/2002 | Hoffman et al. ............... 73/777 |
| 6,707,232 | B2 | * | 3/2004 | Iino et al. .............. 310/323.02 |
| 7,093,498 | B2 | * | 8/2006 | Herbert et al. ................. 73/778 |
| 2010/0194243 | A1 | * | 8/2010 | Yoneyama ................... 310/338 |

OTHER PUBLICATIONS

Gardonio, P. and Elliott, S. J., "Smart Panels With Velocity Feedback Control Systems Using Triangularly Shaped Strain Actuators". Journal of the Acoustical Society of America (2005), 117(4). 2046-2064.

(Continued)

*Primary Examiner*—Thomas M Dougherty
(74) *Attorney, Agent, or Firm*—Andrea Z. Warmbier; Helen M. Galus

(57) ABSTRACT

A transducer for use with a boundary-stiffened panel has an inter-digitated electrode (IDE) and a piezoelectric wafer portion positioned therebetween. The IDE and/or the wafer portion are triangular, with one edge or side aligned with a boundary edge of the panel. The transducer generates and transmits an output force to the panel in response to an input voltage signal from a sensor, which can be another transducer as described above or an accelerometer. A controller can generate an output force signal in response to the input voltage signal to help cancel the input voltage signal. A method of using the transducer minimizes vibration in the panel by connecting multiple transducers around a perimeter thereof. Motion is measured at different portions of the panel, and a voltage signal determined from the motion is transmitted to the transducers to generate an output force at least partially cancelling or damping the motion.

26 Claims, 3 Drawing Sheets

OTHER PUBLICATIONS

Lee, Y.S., Elliott, S.J., and Gardonio, P., "Matched Piezoelectric Double Sensor/Actuator Pairs for Beam Motion Control", Smart Materials and Structures (2003), 12, 541-548.

Schiller, N. H., Cabell, R.H., and Fuller, C.R., "Decentralized Control of Sound Radiation Using A High-Authority Low-Authority Control Strategy With Anisotropic Actuators", Proceedings of Acoustics '08, Paris, France, Jun. 29-Jul. 4, 2008.

Sullivan, J. M., Hubbard, J. E., and Burke, S. E., "Modeling Approach for Two-Dimensional Distributed Transducers of Arbitrary Spatial Distributions", Journal of the Acoustical Society of America, 99(5), 2965-2974.

Wilkie, W. K., Bryant, R. G., High, J. W., Fox, R. L., Hellbaum, R. F., Jalink, A., Little, B. D., and Mirick, P. H., "Low-cost Piezocomposite Actuator for Structural Control Applications", Proceedings of the SPIE 7th Annual International Symposium on Smart Structures and Materials (2000), Newport Beach, CA.

* cited by examiner

DUAL-USE TRANSDUCER FOR USE WITH A BOUNDARY-STIFFENED PANEL AND METHOD OF USING THE SAME

TECHNICAL FIELD

The present invention relates to a dual-function or dual-use transducer used for generating a transverse point load and/or for measuring a transverse velocity on a rib-stiffened or other boundary-stiffened panel, and a method of using the same.

BACKGROUND OF THE INVENTION

Active control systems are often used to suppress noise and/or vibration in certain structures. For example, aboard aerospace structures, noise and vibration reduction can be achieved using compact, surface-mounted piezoelectric actuators. As will be understood by those of ordinary skill in the art, the term "piezoelectric" generally describes the natural capability of certain classes of crystalline materials, e.g., quartz, tourmaline, lead zirconate titanates, barium titanate, etc., to produce a proportional voltage in response to an applied mechanical force or pressure. Piezoelectric materials can also change their shape and/or dimensions in response to an applied electric field, thereby making piezoelectric materials potentially useful as actuators in a host of different applications.

In one particularly simple and robust vibration control strategy referred to as "active damping," the output of a velocity sensor is fed back to a point force actuator via a fixed control gain. The control approach is guaranteed to be stable for any value of the control gain if the actuator and sensor are matched. However, actuator/sensor pairs in actuality are never perfectly matched, thus necessitating the limitation of any applied control gain to minimize spillover and other system stability issues. Often, an electromagnetic shaker can be used to generate a point force while the integrated response from an accelerometer is used to measure velocity. While the transducers may not be perfectly matched, they are often adequate for vibration control applications. Unfortunately, shakers tend to be large, bulky, and require an inertial base from or against which to react.

Due to the severe space and weight constraints associated with many applications, and in aerospace applications in particular, considerable research has focused on piezoelectric patch actuators, which are compact and can be integrated into the structure. For instance, in U.S. Pat. No. 4,849,668 to Crawley et al., a laminate structural member is provided having embedded piezoelectric elements for sensing and control. Similarly, U.S. Pat. No. 4,565,940 to Hubbard Jr. describes a method for using piezoelectric film to control or damp vibrations in mechanical systems.

Other work has explored the advantages of spatially weighting distributed transducers. For instance, U.S. Pat. No. 5,054,323 of Hubbard Jr., et al. utilizes multiple triangularly-shaped segmented electrodes to characterize the pressure distribution on a rigid surface. By shaping a distributed transducer, researchers are able to vary how the device couples to the structural response. For instance, a triangular shape has been shown to couple to the flexural response of a cantilevered beam in exactly the same way as a point load or sensor applied at the tip of the transducer. However, this result has not been extended to two-dimensional structures such as plates.

Research pertaining to shaped piezoelectric transducers has established that the Laplacian of the spatial distribution determines how the transducer couples to the flexural response of a given structure. Generally triangular-shaped piezoelectric actuators have been demonstrated as capable of producing transverse point forces at each vertex of the actuator, and bending moments along each edge of the actuator. If the base edge of the actuator is aligned along a fixed boundary of a panel structure, then the point forces or loads and the line moment along the base of the actuator do not couple to the structural response. Therefore, a single point sensor that is positioned at a vertex of the actuator opposite the base edge can yield a substantially, although not perfectly, matched sensor/actuator pair. However, line moments created along the lateral edges of the actuator can cause undesirable high-frequency phase problems, which in turn can destabilize certain control methodologies such as negative rate-feedback control.

SUMMARY OF THE INVENTION

Accordingly, a dual-use transducer is provided herein. The transducer in accordance with the invention has potential utility in many industries, such as in an exemplary application wherein active noise and/or dissipative vibration control is highly desirable, and with particular utility when used in conjunction with a boundary-stiffened panel. As used herein, boundary-stiffened panels are characterized by a compliant substructure that is divided or segmented into individual sections or bays by one or more ribs or other suitably rigid stiffener portions. If the stiffener portions approximate a theoretically clamped boundary, then the distribution of a plurality of the shaped transducers of the invention around the perimeter of the panel in conjunction with the present invention can form an effective active control system for reducing the severity of vibrations in the panel.

Within the scope of the invention, the transducer is piezoelectric in nature, and is multi-functional or dual-use in the sense that it can generate a predetermined transverse point load when employed as an actuator, and can measure a transverse point response or transverse velocity when employed as a sensor. The transducer includes a piezoelectric wafer portion and one or more inter-digitated electrodes (IDE), at least one of the piezoelectric wafer portion and IDE being substantially triangular in shape. When used in its capacity as an actuator, the IDE applies a predetermined electric field in a preferred in-plane direction. When used in its capacity as a sensor, the same IDE can collect an electrical charge that is proportional to the flexural vibration at the tip of the sensor. In either capacity, the requisite substantially triangular shape has a base side or edge that is aligned along a fixed edge or boundary edge of the panel.

More particularly, the transducer is a compact and lightweight device that can be surface-mountable or embeddable with respect to the panel, and which includes a piezoelectric material or wafer portion attached to one IDE or sandwiched or positioned between two IDE, with the IDE enabling the application of a predetermined electric field in a preferred in-plane direction. The transducer does not generate destabilizing line moments along its lateral edges, and can be used with a separate point sensor or itself configured as a point sensor to measure motion at a single point on the panel structure, with the charge output of the transducer proportional to the flexural vibration at the tip or vertex of the actuator/sensor. Alternately, the transducer can be used solely as an actuator in conjunction with a corresponding point sensor such as a miniaturized accelerometer.

As provided herein, in at least one advantageous embodiment of the present invention, an apparatus for minimizing vibration in a stiffened panel includes a transducer having a pair of or a single set of IDE and a piezoelectric wafer portion positioned between the pair of IDE or on one side of a single IDE depending on the particular configuration. The transducer generates a force on the stiffened panel in response to an input voltage signal. The apparatus also includes a sensor that is operable for measuring the vibration at a surface portion of the stiffened panel, and that generates an output voltage signal in proportion to the measured vibration. A controller is electrically connected to the transducer and the sensor, with the controller configured to generate an output force signal in response to the input voltage signal. At least one of the piezoelectric wafer portion and the IDE is substantially triangularly in shape, with the output force signal adapted to induce the output force.

In accordance with a least one advantageous embodiment of the present invention, a method controls or minimizes vibration in a stiffened panel, and includes connecting triangular transducers around a perimeter of the stiffened panel such that a base edge of each transducer is aligned with a boundary of the perimeter. Each transducer includes a piezoelectric wafer attached to one or two IDE as described above. The method includes measuring a quantity of motion such as linear velocity at different surface portions of the stiffened panel, determining a proportional voltage signal from the quantity of motion. The proportional voltage signal for each of the different surface portions is transmitted to a corresponding transducer, here acting as an actuator, to generate a corresponding output force in proximity to the surface portion. This output force at least partially cancels the quantity of motion in proximity to the surface portion.

The above features and advantages and other features and advantages of the present invention are readily apparent from the following detailed description of the best modes for carrying out the invention when taken in connection with the accompanying drawings.

DESCRIPTION OF THE PREFERRED EMBODIMENTS

Figure 1:
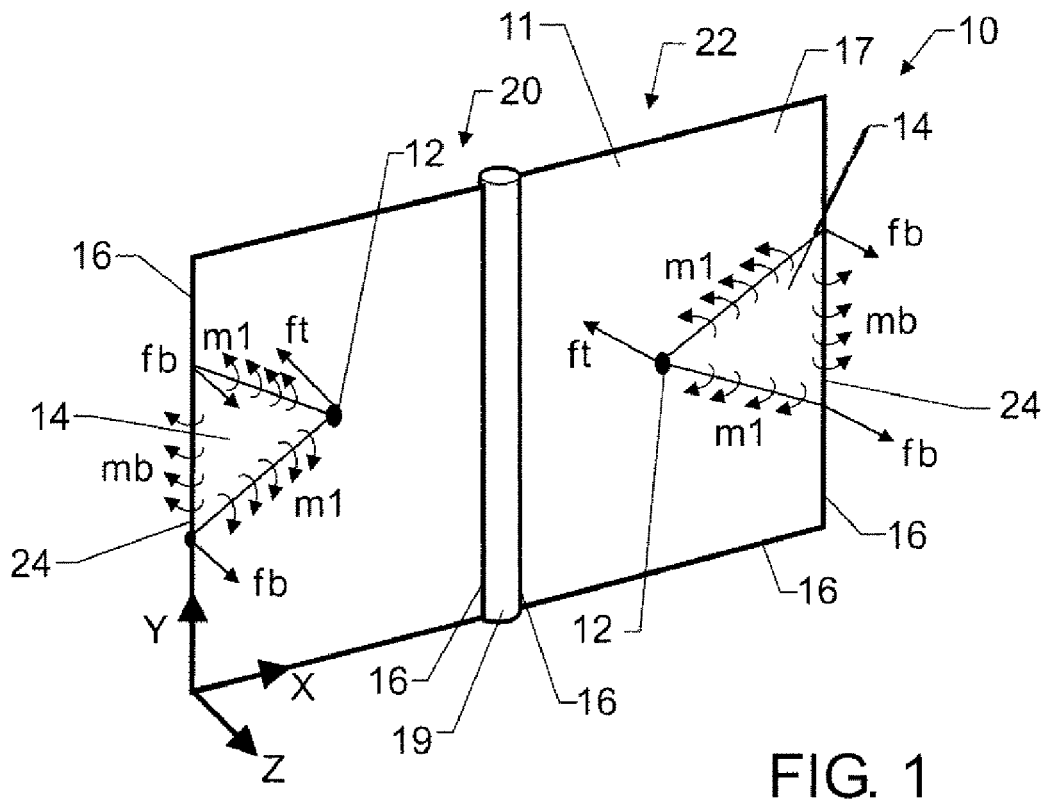
FIG. 1 is a schematic perspective view of an exemplary rib-stiffened panel depicting various point forces and line moments.

Referring to the drawings wherein like reference numbers represent like components throughout the several figures, and beginning with FIG. 1, an exemplary panel 10 is configured as a rib-stiffened panel structure of the type known in the art. That is, one or more stiffener portions or ribs 19 divide or segment a compliant substructure 11 into individual sections or bays 20, 22. The compliant substructure 11 is constructed of a generally compliant material suited to the intended use of the panel 10. For example, when the panel 10 is intended for use in forming an aircraft fuselage the panel 10 can be constructed of a suitable light weight material, e.g., 6061-T6 aluminum, etc.

Regardless of its ultimate use, the panel 10 has suitably rigid edges or boundaries 16 around its perimeter that approximate clamped boundaries. As shown, a pair of substantially triangular-shaped transducers 14 are surface mounted to an inner surface 17 of the compliant substructure 11. The shaped transducers 14 are constructed at least partially of a suitable piezoelectric material. As will be understood by those of ordinary skill in the art, piezoelectric materials can be crystalline structures or ceramics which produce a proportional output voltage when a mechanical force or stress is applied thereto. Since this effect also applies in the reverse manner, an input voltage applied to a sample piezoelectric material such as the shaped transducers 14 will produce a proportional mechanical force or stress, which can be imparted to the panel 10. The activation of a typical piezoelectric material can result in a change in dimension of approximately 0.1% for piezo-ceramics and 1% for piezo-polymers. Suitably designed transducer structures made from these particular materials can therefore be made that bend, expand, or contract as desired when a voltage is applied thereto.

The shaped transducers 14, being triangular in design, each have three vertices, and are able to generate or produce transverse point forces or loads ($f_b$, $f_t$) at each vertex, wherein the subscript "b" refers to the base edge of each shaped transducer 14. The shaped transducer 14 also produces or generates bending moments ($m_b$, $m_1$) along each of its sides or edges. In particular, and with special reference to Gardonio, P. and Elliott, S. J. (2005), "Smart panels with velocity feedback control systems using triangularly shaped strain transducers", *Journal of the Acoustical Society of America*, 117(4), 2046-2064, the moment excitation along the lateral edges of a triangular-shaped transducer such as the transducer 14 can be mathematically defined as $m_1(t)=h_s/2(m^2 e_{31}+e_{32})v_c(t)$, wherein the variable ($h_s$) is the combined thickness of the compliant substructure 11 and the shaped transducer 14, the variable (m) is the slope of the lateral edge of the shaped transducer 14, and the variable ($e_{31}$) is a piezoelectric material constant relating the electric field applied in the 3 or z direction to the stress induced in the 1 or x direction. Likewise, the variable ($e_{32}$) is the piezoelectric material constant relating the electric field applied in the 3 or z direction to the stress induced in the 2 or y direction, with the variable $v_c(t)$ describing the applied or input voltage.

Similarly, the moment excitation along the base edge 24 of the transducer 14 is defined as $m_b(t)=h_s/2(e_{31})v_c(t)$, while the point forces $f_b$ generated at the base vertices of the shaped transducer 14 are defined as $f_b(t)=2\ m(h_s/2)(e_{31})v_c(t)$. The point force $f_t$ at the tip of the shaped transducer 14 is defined as $f_t(t)=(-4\ m)(h_s/2)(e_{31})v_c(t)$. It is noted that when the base edge 24 of the shaped transducer 14 is aligned along a fixed boundary such as the boundary 16 of the substructure 11, then the point forces ($f_b$) and the line moment ($m_b$) along the base edge 24 of the shaped transducer 14 do not couple to the structural response. Therefore, a single point sensor 12, such as a miniaturized accelerometer, that is placed at the tip of the shaped transducer 14, i.e., the vertex opposite the base edge 24, can yield a substantially matched sensor/transducer pair. However, the line moments ($m_1$) along the lateral edges of the shaped transducer 14 can still cause undesirable high-frequency phase problems which can destabilize certain vibration control methodologies and systems.

Figure 2:
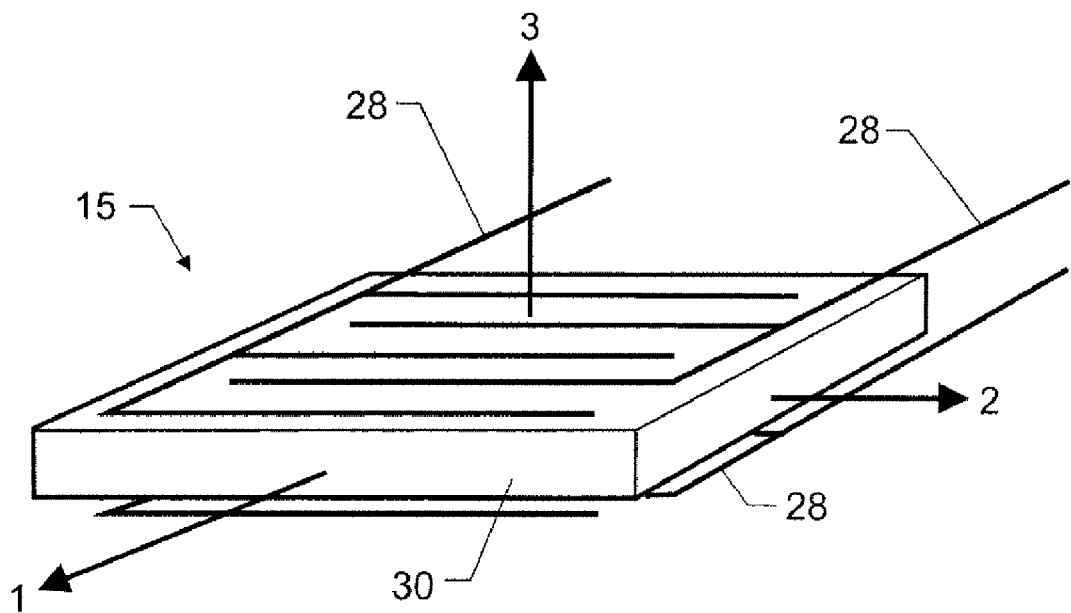
FIG. 2 is a schematic perspective side view of a baseline or unshaped multi-use transducer having inter-digitated electrodes (IDE)

Referring to FIG. 2, within the scope of the invention the shaped transducers 14 of FIG. 1 each can include one or a pair of inter-digitated electrodes or IDE 28. An unshaped transducer 15 is shown in FIG. 2 to more clearly show the IDE 28, with the shaped transducers 14A, 14B, and 14C of the invention discussed below with reference to FIGS. 3A, 3B, 4A, and 4B. A piezoelectric wafer 30 is attached or connected to one IDE 28 or interposed or sandwiched between a pair of the IDE 28. Unlike a conventional monolithic shaped transducer 14 of the type shown in FIG. 1, in which the electric field couples to both in-plane directions equally, the IDE pattern used within the scope of the invention enables the application of an electric field in a preferred in-plane direction. The Macro-Fiber Composite (MFC) actuator distributed by Smart Material Corporation of Sarasota, Fla., provides such an IDE pattern. More importantly, the sign of the piezoelectric material constants ($e_{11}$, $e_{12}$) in the respective 1 and 2 directions are opposite using the IDE 28. Therefore, using a piezoelectric transducer with IDE in accordance with the invention can provide a zero lateral edge moment $m_1(t)$, i.e., $h_s/2(e_{11+}e_{12})v_c(t)=0$.

To optimize noise and vibration control aboard an aircraft, it is advantageous to eliminate the destabilizing line moments ($m_1$) of FIG. 1 along the lateral edges of any distributed transducers. This can be accomplished by using anisotropic or directionally-dependent devices such as the shaped transducer 14A, 14B, 14C described below with reference to FIGS. 3A, 3B, 4A, and 4B to generate a tensile stress in one in-plane direction and a comprehensive stress in the other in-plane direction. Use of the IDE pattern shown in FIG. 2 in conjunction with a substantially triangular shape of either the piezoelectric wafer 30 or the IDE 28 itself helps to achieve this, with the IDE pattern allowing application of an electric field in the 1-direction as noted above.

Figure 3A:
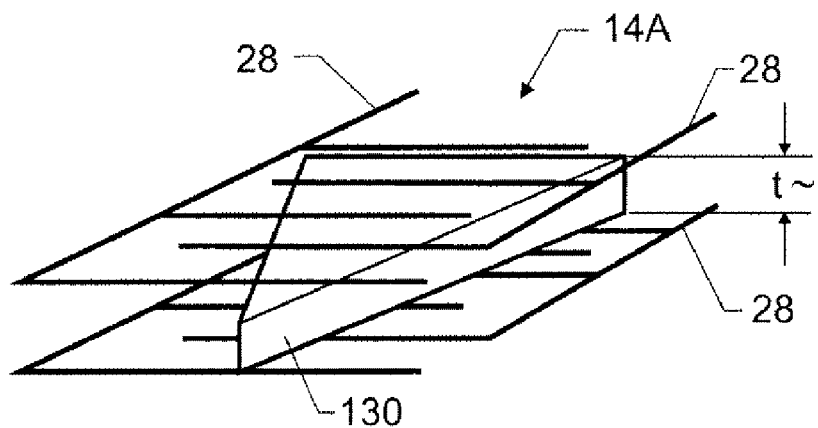
FIG. 3A is a schematic perspective view of a shaped transducer according to one embodiment of the invention.
Figure 3B:
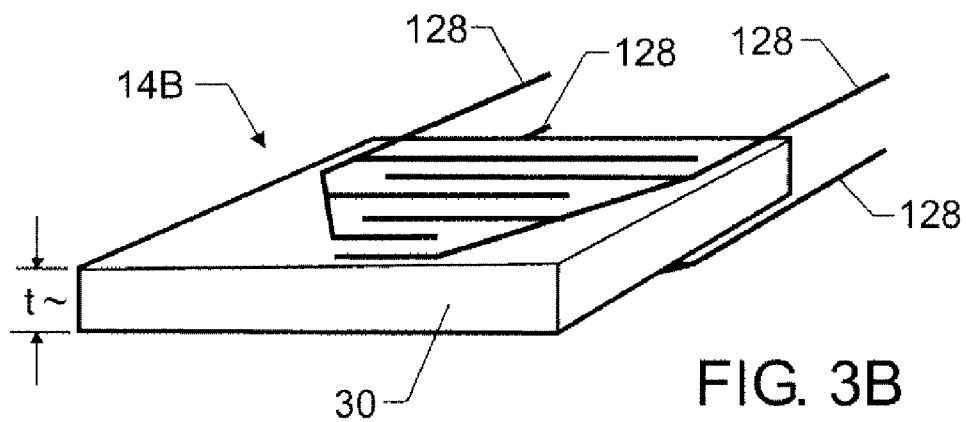
FIG. 3B is a schematic perspective view of shaped transducer according to another embodiment of the invention.
Figure 4B:
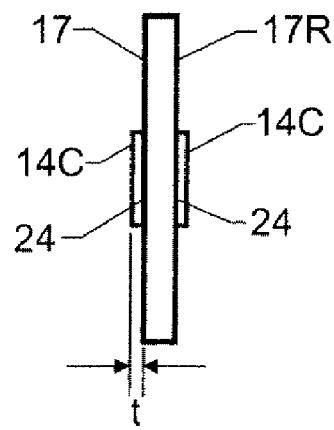
FIG. 4B is a schematic side view of a boundary-stiffened panel having a plurality of shaped transducers according to another embodiment.
Figure 4A:
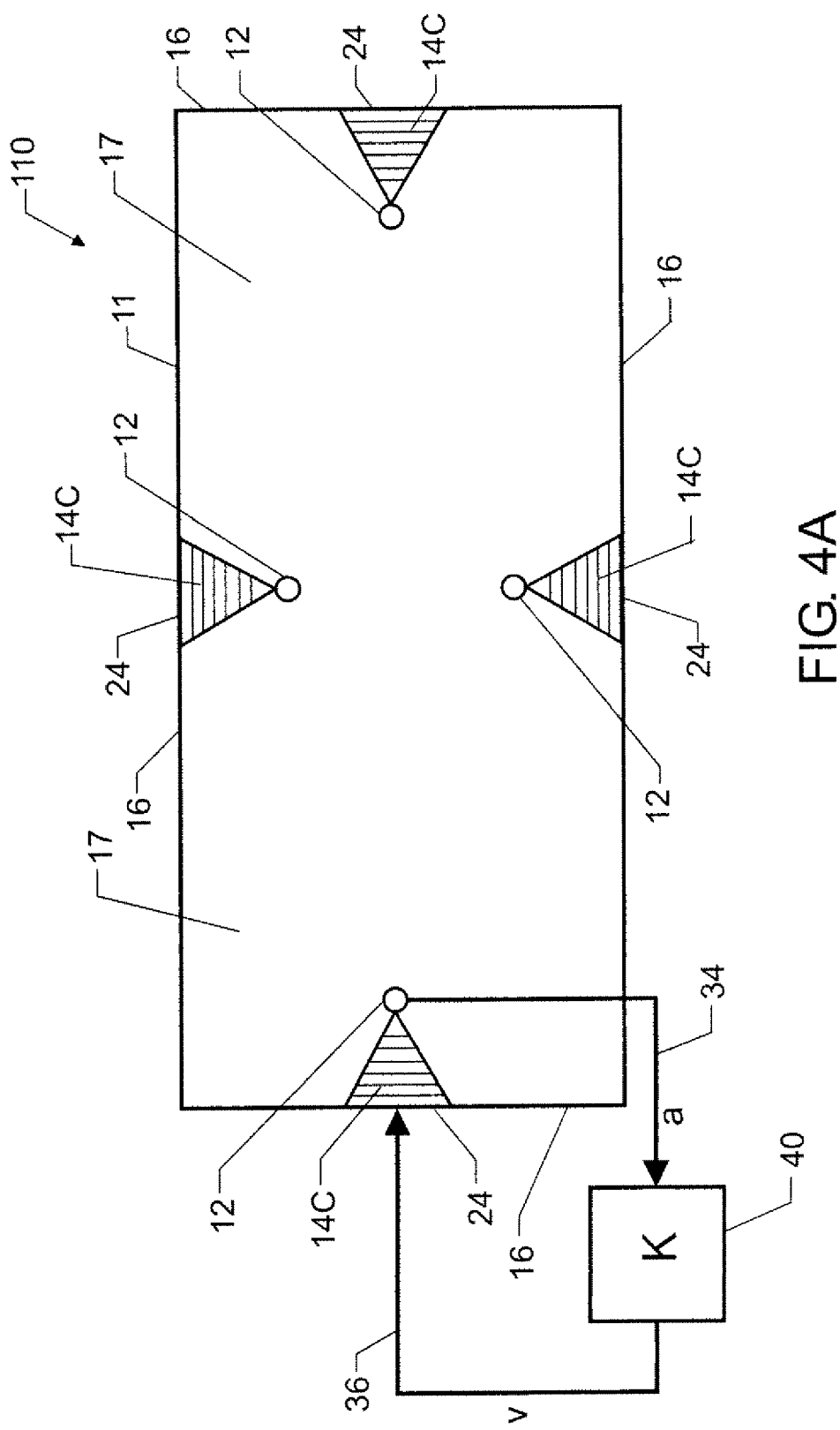
FIG. 4A is a schematic plan view of a boundary-stiffened panel having a distributed plurality of shaped transducers with closed-loop vibration controls.

Referring to FIGS. 3A, 3B, 4A, and 4B, in accordance with the invention a shaped transducer 14A, 14B, 14C provides a substantially triangular shape in conjunction with the IDE 28, 128 to zero the destabilizing line moments ($m_1$)(see FIG. 1) along the lateral edges of the transducer 14A, 14B, 14C. The desired triangular shape can be achieved in at least three manners: (a) by shaping the piezoelectric wafer 30 of FIG. 2 into a substantially triangular-shaped wafer 130 as shown in FIG. 3A, (b) by shaping the IDE 28 of FIG. 2 to form a substantially triangular-shaped IDE 128, without modifying the shape of the piezoelectric wafer 30 of FIG. 2, or (c) by shaping both the piezoelectric wafer 30 of FIG. 2 and the IDE 28 of FIG. 2 to form a substantially triangular-shaped transducer 14C as shown in FIGS. 4A and 4B.

If the shaped transducer 14A, 14B, 14C is properly aligned with a clamped edge or barrier 16 of the panel 10 (see FIG. 1), then the point forces and line moments along the base edge 24 (see FIG. 1) of the shaped transducer 14A, 14B, 14C will not couple to the response of the panel 10. Additionally, the shaped transducers 14A, 14B, 14C couple to the flexural vibration of the compliant substructure 11 of FIG. 1 in exactly the same way as would a single transverse point load or sensor 12 (see FIG. 1) located at the tip of the shaped transducer 14A, 14B, 14C.

Referring to FIG. 4A, the panel 110 is configured as a boundary-stiffened panel structure with a distributed plurality of shaped transducers 14C attached to the interior surface 17 of the panel 110 around the perimeter of the compliant substructure 11. While four shaped transducers 14C are shown in FIG. 4A, those of ordinary skill in the art will recognize that the number and/or relative size of the shaped transducers 14C can vary within the scope of the invention, with additional shaped transducers 14C providing greater control authority, and with an increasing size of the shaped transducers 14C generally leading to an increased sensitivity to boundary conditions. Likewise, while the shaped actuator 14C is shown in FIGS. 4A and 4B for simplicity, the description below also applies to the shaped transducers 14A of FIGS. 3A and 14B of FIG. 3B. In one embodiment, the shaped transducer 14C is approximately 2.5 to 5 mm thick, has a base width (W) of approximately 0.03 to 0.04 meters (m), and has a height (H) of approximately 0.06-0.07 m, although other sizes can be used within the scope of the invention.

In the embodiment of FIG. 4A, the shaped transducers 14C are each attached to the interior surface 17 of the compliant substructure 11, which as noted above can represent an internal surface or pressurized side of an aircraft fuselage or other similar structure subject to vibration and noise in a similar fashion. A point sensor 12 is positioned at the peak of each shaped transducer 14C. The point sensor 12 can be configured as a miniaturized accelerometer adapted to precisely measure, sense, or otherwise determine the value of a linear acceleration of a portion of the compliant substructure 11 in immediate proximity to that particular point sensor 12 performing the measurement. A feedback signal 34 describing the measured vibration or force, such as in the form of a raw linear acceleration value ($\alpha$), is transmitted or relayed from each point sensor 12 to an electronic control unit or controller 40.

The controller 40 receives the transmitted feedback signal 34 and calculates or otherwise determines a linear velocity (v) value therefrom. After calculating the linear velocity, the controller 40 generates a control signal 36 as a calibrated or proportional voltage signal (V), which is then transmitted to the shaped transducer 14C as an input command. The shaped transducer 14C is adapted to apply a predetermined force or vibration signal to the compliant substructure 11 in response to the proportional voltage of the control signal 36. As used herein, the term "proportional voltage" describes a scaled negative voltage producing motion in the compliant substructure 11 that effectively cancels or at least partially offsets or damps the vibration or motion that is measured, detected, or otherwise determined by the point sensor 12.

The controller 40 can be configured as a general purpose closed-loop control device. As such, the controller 40 has the necessary operational amplifiers, capacitors, and/or other necessary electronic circuitry components required for manipulating one or more control variables, including the feedback signal 34, in order to generate the scalar negative or proportional voltage (V) signal as the control signal 36. However configured, the controller 40 is operable for processing the raw data transmitted from a corresponding point sensor 12, determining the linear acceleration ($\alpha$) of the compliant substructure 11 in close proximity to that point sensor 12, and for calculating a linear velocity (v) value therefrom. From this intermediate value, the controller 40 generates a scalar negative or proportional voltage signal (V) as the output signal 36, which can be modified as needed via a calibrated applied gain (k), i.e., a constant of proportionality, as needed to thereby affect the desired vibrational attenuation in the compliant substructure 11.

Referring to FIG. 4B, the panel 110 is shown in side view to present an alternate embodiment in which the point sensors 12 are not used. Instead, a matching set of shaped actuators 14C are used, with one placed on the reverse side 17R of the compliant substructure 11, i.e., the side opposite the internal surface 17 previously described hereinabove, and one on the internal surface 17. When the panel 110 is configured as an integral portion of an aircraft fuselage as described above, the reverse side 17R would correspond to the depressurized or external surface of the fuselage. Therefore, such a configuration may be less than optimal in terms of accessibility, although such a configuration may retain utility in other vibration or noise control applications.

When shaped transducers 14C are used without a corresponding point sensor 12, as shown in FIG. 4B, a shaped transducer 14C on the inner surface 17 can be positioned precisely opposite to the shaped transducer 14C on the reverse surface 17R, such that the apexes of the shaped transducers 14C that are coincident with the position of the point sensor 12 of FIG. 4A are positioned directly opposite each other, with only the thickness of the compliant substructure 11 interposed therebetween. One set of the shaped transducers 14C, such as the set that is surface-mounted to or embedded within the reverse surface 17R, is configured to generate a voltage in response to motion of the compliant substructure 11 at that location. This voltage is fed to the controller 40 (see FIG. 4A) described above, where it is processed in the same manner therein to provide the control signal 36 back to the other set of shaped transducers 14C.

While the best modes for carrying out the invention have been described in detail, those familiar with the art to which this invention relates will recognize various alternative designs and embodiments for practicing the invention within the scope of the appended claims.

What is claimed as new and desired to be secured by Letters Patent of the United States is:

1. An apparatus for minimizing vibration in a boundary-stiffened panel, the apparatus comprising:
    a transducer having a pair of inter-digitated electrodes (IDE) and a piezoelectric wafer portion positioned between said pair of IDE, said transducer being adapted to generate and transmit an output force to the stiffened panel in response to an output force signal;
    a sensor that is operable for measuring the vibration at a surface portion of the stiffened panel, and adapted for generating an input voltage signal in proportion to said vibration; and
    a controller that is electrically connected to each of said transducer and said sensor, said controller being configured to generate said output force signal in response to said input voltage signal;
    wherein at least one of said piezoelectric wafer portion and said pair of IDE is a substantially triangularly-shaped component, and wherein said output force signal is adapted to induce said output force.

2. The apparatus of claim 1, wherein said sensor is an accelerometer positioned at an apex of said substantially triangularly shaped component, and wherein said input voltage signal is a linear acceleration of said surface portion of the boundary-stiffened panel.

3. The apparatus of claim 1, wherein said sensor is a second transducer having a second pair of IDE and a second piezoelectric wafer portion positioned between said second pair of IDE.

4. The apparatus of claim 1, wherein the boundary-stiffened panel is constructed at least partially of aluminum.

5. The apparatus of claim 1, wherein said substantially triangularly shaped component has a height of approximately 0.06 m to approximately 0.07 m and a width of approximately 0.03 m to approximately 0.04 m.

6. The apparatus of claim 1, wherein the boundary-stiffened panel is configured for use as a rib-stiffened aircraft fuselage panel.

7. A transducer configured for use with a boundary-stiffened panel, the transducer comprising:
    a piezoelectric wafer portion; and at least one inter-digitated electrode (IDE) connected to a surface of said piezoelectric wafer portion, wherein at least one of said piezoelectric wafer portion and said at least one IDE is substantially triangular in shape to thereby define three sides;
    wherein one side of said three sides is aligned with an edge of the boundary-stiffened panel, and wherein the remaining two sides of said three sides are configured to minimize lateral edge moments of the transducer.

8. The transducer of claim 7, wherein said at least one IDE is a pair of IDE, and wherein said piezoelectric wafer portion is positioned between said pair of IDE such that each of said pair of IDE is connected to a different surface of said piezoelectric wafer portion.

9. The transducer of claim 7, wherein the transducer is operable for use as at least one of: a point sensor adapted for measuring vibration in a portion of the boundary-stiffened panel, and an actuator adapted for generating a transverse force on the boundary-stiffened panel.

10. The transducer of claim 9, wherein the transducer is adapted for use with a proportional feedback controller, and is operable for at least partially cancelling said vibration in proximity to the transducer.

11. The transducer of claim 7, wherein the boundary-stiffened panel is adapted for use on an aircraft fuselage panel.

12. A method for controlling vibration in a stiffened panel, the method comprising:
    connecting a plurality of triangular transducers around a perimeter of the stiffened panel such that a base edge of each of said plurality of triangular transducers is aligned with a boundary of said perimeter, wherein each of said plurality of triangular transducers includes a piezoelectric wafer interposed between a pair of inter-digitated electrodes (IDE);
    measuring a quantity of motion at different surface portions of the stiffened panel;
    determining a proportional voltage signal from said quantity of motion;
    transmitting said proportional voltage signal for each of said different surface portions to a corresponding one of said triangular transducers to thereby generate a corresponding output force in proximity to each said surface portion, thereby at least partially cancelling said quantity of motion in proximity to each said surface portion.

13. The method of claim 12, wherein measuring a quantity of motion includes measuring a linear acceleration value of said surface portion using a miniature accelerometer.

14. The method of claim 13, further comprising calculating a linear velocity value using said linear acceleration value.

15. The method of claim 14, wherein determining said voltage signal includes applying a predetermined proportional gain to said linear velocity value.

16. The method of claim 12, wherein the stiffened panel is configured for use as a bay of an aircraft fuselage, and wherein said connecting a plurality of transducers around a perimeter of the panel includes connecting at least one said transducer to each boundary of the bay.

17. The method of claim 12, wherein said plurality of triangular transducers comprise aligned pairs of triangular transducers wherein one of each pair is disposed on opposite surfaces of the stiffened panel.

18. The method of claim 13, wherein each said accelerometer is disposed at an apex of one of said plurality of substantially triangular tranducers.

19. A method for controlling vibration in a stiffened panel, the method comprising:
    providing a plurality of transducers each comprising a piezoelectric wafer portion and at least one inter-digitated electrode (IDE) connected to a surface of said piezoelectric wafer portion, wherein at least one of said piezoelectric wafer portion and said at least one IDE is substantially triangular in shape to thereby define three sides;

connecting said plurality of transducers around a perimeter of the stiffened panel such that one side of said three sides is aligned with a boundary of said perimeter;

measuring a quantity of motion at different surface portions of the stiffened panel;

determining a proportional voltage signal from said quantity of motion;

transmitting said proportional voltage signal for each of said different surface portions to a corresponding one of said triangular transducers to thereby generate a corresponding output force in proximity to each said surface portion, thereby at least partially cancelling said quantity of motion in proximity to each said surface portion.

20. The method of claim 19, wherein said at least one inter-digitated electrode comprises a pair of inter-digitated electrodes with said piezoelectric wafer portion interposed between them such that each of said pair of IDE is connected to a different surface of said piezoelectric wafer portion.

21. The method of claim 19, wherein measuring a quantity of motion at different surface portions includes measuring a linear acceleration value of each said surface portions using a miniature accelerometer.

22. The method of claim 21, further comprising calculating a linear velocity value using said linear acceleration value.

23. The method of claim 22, wherein determining said voltage signal includes applying a predetermined proportional gain to said linear velocity value.

24. The method of claim 19, wherein the stiffened panel is configured for use as a bay of an aircraft fuselage, and wherein said connecting said plurality of transducers around a perimeter of the panel includes connecting at least one said transducer to each boundary of the bay.

25. The method of claim 19, wherein said plurality of transducers comprise a plurality of aligned pairs of transducers wherein one of each pair is disposed on opposite sides of the stiffened panel.

26. The method of claim 21, wherein each of said accelerometers is disposed at an apex defined by said three sides.

* * * * *